(12) United States Patent
Yan

(10) Patent No.: US 7,990,452 B2
(45) Date of Patent: Aug. 2, 2011

(54) APPARATUS, METHODS AND SYSTEMS FOR AMPLIFIER

(75) Inventor: Hai Yan, Fontana, CA (US)

(73) Assignee: Aptina Imaging Corporation, George Town (KY)

( * ) Notice: Subject to any disclaimer, the term of this patent is extended or adjusted under 35 U.S.C. 154(b) by 1219 days.

(21) Appl. No.: 11/700,487

(22) Filed: Jan. 31, 2007

(65) Prior Publication Data

US 2008/0180559 A1   Jul. 31, 2008

(51) Int. Cl.
*H04N 3/14* (2006.01)
*H03F 3/04* (2006.01)
*H01L 29/66* (2006.01)

(52) U.S. Cl. .......... 348/300; 330/250; 257/159

(58) Field of Classification Search .......... 348/294, 348/300, 302, 307, 241, 317; 330/250, 295, 330/255, 260, 262; 257/159
See application file for complete search history.

(56) References Cited

U.S. PATENT DOCUMENTS

| | | | |
|---|---|---|---|
| 5,471,515 A | 11/1995 | Fossum et al. | |
| 5,841,126 A | 11/1998 | Fossum et al. | |
| 6,128,039 A * | 10/2000 | Chen et al. | 348/294 |
| 6,346,834 B1 * | 2/2002 | Chai | 327/143 |
| 7,068,319 B2 | 6/2006 | Barna et al. | |
| 7,116,172 B2 * | 10/2006 | Siniscalchi | 330/260 |
| 7,230,479 B2 | 6/2007 | Forbes et al. | 330/9 |
| 7,368,990 B2 * | 5/2008 | Tsuchi | 330/261 |
| 7,714,919 B2 * | 5/2010 | Inoue et al. | 348/300 |
| 2002/0134918 A1 * | 9/2002 | Miida | 250/214.1 |
| 2005/0206752 A1 * | 9/2005 | Lim | 348/241 |
| 2005/0285676 A1 * | 12/2005 | Jones | 330/255 |
| 2006/0164533 A1 * | 7/2006 | Hsieh et al. | 348/317 |
| 2006/0231733 A1 * | 10/2006 | Boemler | 250/208.1 |

\* cited by examiner

*Primary Examiner* — Nhan T Tran
(74) *Attorney, Agent, or Firm* — Jason Tsai

(57) ABSTRACT

Various embodiments comprise apparatus, methods, and systems that include an amplification apparatus comprising a first input, a second input, and an output, a first plurality of series-connected transistors including a first transistor having a first channel ratio and a first gate coupled to the first input, and a second plurality of series-connected transistors including a second transistor having a second channel ratio that is greater than the first channel ratio, the second transistor including a second gate coupled to the second input.

28 Claims, 7 Drawing Sheets

APPARATUS, METHODS AND SYSTEMS FOR AMPLIFIER

FIELD OF THE INVENTION

Various embodiments described herein relate generally to image sensors, including image sensors having an amplifier

BACKGROUND

Electronic devices may include imaging sensors capable of converting a light signal to an electronic signal that may be further processed for intended purposes such as display or storage. Imaging sensors may include a plurality of photosensitive elements arranged in an array including rows and columns. Each of the photosensitive elements may receive a portion of the light signal being received as a scene or as an image being sensed by the imaging sensor. Each of these portions of the image being sensed may be referred to as a pixel. The combination of these portions of the images captured as pixels by the array of imaging sensors represents the image being sensed by the imaging sensor. The portions of the image captured by each pixel may be represented by a electronic signal provided by a device such as a photodiode. In most instances, the electronic signal is further processed by one or more additional electronic circuits before the electronic signals may be used for one or more of its intended purposes.

In readout circuitry for complementary metal-oxide semiconductor (CMOS) imaging sensors, first-stage column amplifiers can be effective at reducing circuit noise. However, additional column-wise, fixed pattern noise at the output may result if the amplifier does not exhibit relatively high gain bandwidth and slew rate (to promote rapid settling of the output signal). In some applications, such as those using mega-pixel sensors, low current consumption is also desirable. Thus, there is a need for improved apparatus, methods, and systems that serve to reduce output noise and current consumption in CMOS imaging readout circuitry.

DETAILED DESCRIPTION

Apparatus, methods, and systems for an amplifier used in conjunction with an imaging sensor are described. Thus, in some embodiments, the amplifier is included in the readout circuitry of an electronic imaging sensor. Readout circuitry is not limited to any particular type of circuitry, and may include any type of circuitry used to process a signal provided from an imaging sensor. Similarly, imaging sensors are not limited to any particular type of imaging sensor, and in various embodiments include any type of device capable of receiving electromagnetic radiation, including but not limited to visible light, and converting the received electromagnetic radiation into an electrical signal or signals.

While charge-coupled devices (CCDs) were the prevailing technology in image capture for 30 years, by the late 1990s, they began to be replaced in key applications by CMOS imaging sensors, which draw much less power. This allows the system using a CMOS imaging sensor to run longer on batteries—a major advantage in hand-held products. Since CMOS imaging sensors use the same manufacturing platform as most microprocessors and memory chips, they are easier to produce and more cost-effective than CCDs. By combining all camera functions on-chip—from the capture of photons to the output of digital bits—CMOS imaging sensors reduce the part-count of a digital camera system or other system using a CMOS imaging sensor, which in turn boosts reliability, eases miniaturization, and enables on-chip programming of frame size, windowing, exposure, and other camera parameters. Thus, in various embodiments, the imaging sensor comprises a CMOS imaging sensor.

Embodiments of column amplifiers described herein can provide improved performance, especially with respect to gain bandwidth, slew rate, and current consumption. For example, in some cases, compared to a traditional amplifier design with the same current consumption, various embodiments may provide about 60% improvement in gain bandwidth. In addition, various embodiments described herein may also provide an improvement in slew rate of more than 4 times the slew rate of a conventional design for an amplifier having the same current consumption. Lesser performance (albeit better than traditional designs) may be obtained with reduced current consumption.

Figure 1:
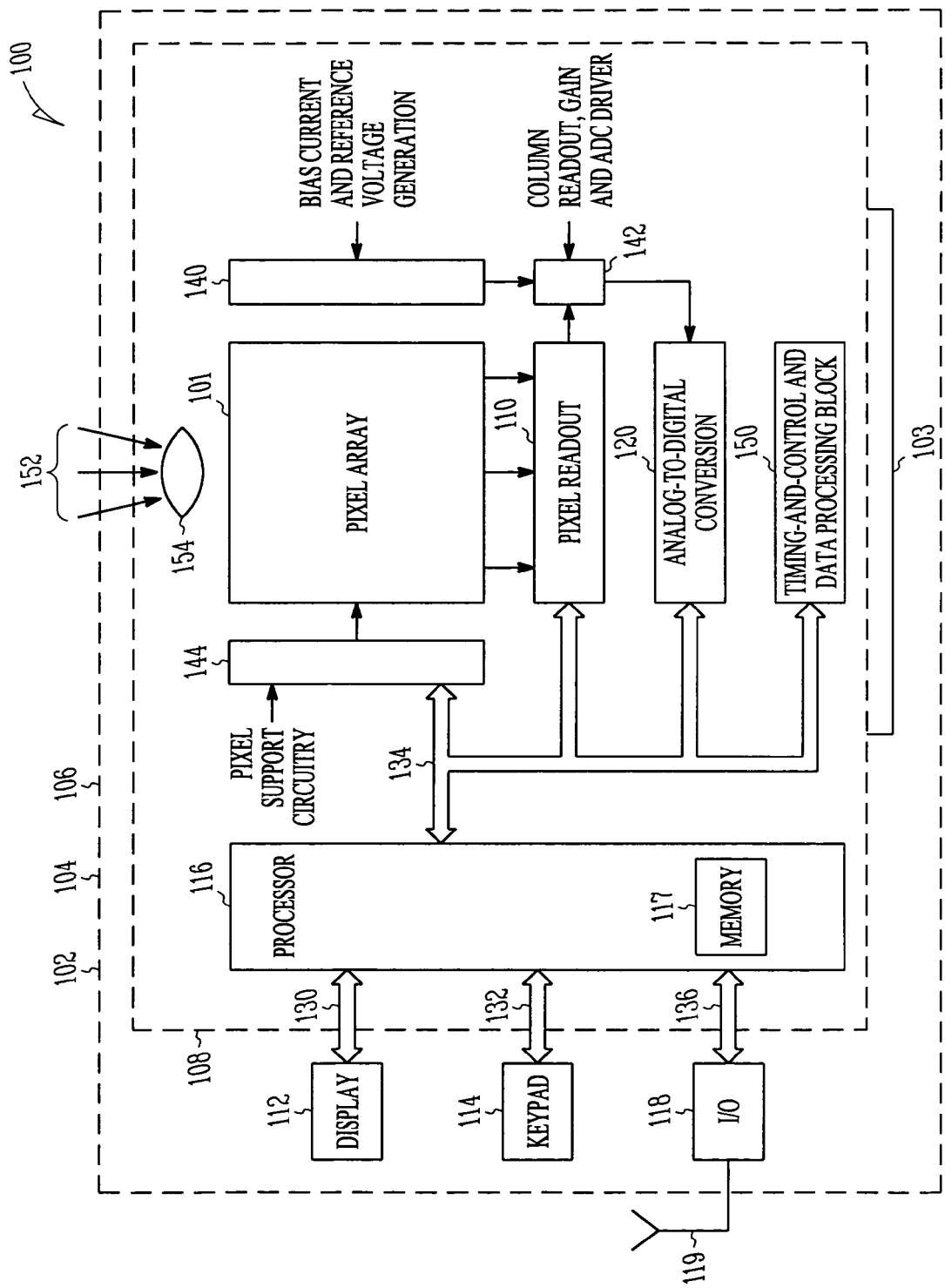
FIG. 1 is a block diagram of a system according to various embodiments of the invention.

FIG. 1 is a block diagram of a system according to various embodiments of the invention. FIG. 1 includes a block diagram of a system 100 according to various embodiment of the invention. The system 100 may include a image sensor 103 and related circuitry, including pixel array 101. System 100 may include a digital camera 102, a cell phone 104, or a video recorder 106. In various embodiments, system 100 includes a lens 154 to focus light 152 or other wavelengths of electromagnetic radiation within system 100. System 100 may include one or more electronic circuits provided on a substrate 108. In various embodiments, lens 154 is formed as part of the integrated circuitry included on substrate 108.

In some embodiments, system 100 includes a processor 116. Processor 116 is not limited to any particular type of processor. The processor 116 may be formed on substrate 108, although embodiments are not limited to the processor 116 being formed on the substrate 108, and/or to the processor 116 being formed on a substrate 108 including an imaging sensor 103. The processor 116 may include memory 117, which is not limited to any particular type of memory, such as volatile and non-volatile types of memory, and cache memory. In various embodiments, memory 117 may be used to store electronic signals provided by pixel array 101. In various embodiments, processor 116 may be coupled to a plurality of electronic circuits on substrate 108 through one or more interconnects, including interconnect 134, which may comprise a bus.

In various embodiments, the electronic circuits on substrate 108 form an imaging sensor 103, including pixel array 101, pixel readout block 110, analog-to-digital conversion (ADC) block 120, bias current and reference voltage generation block 140, column readout, gain and analog-to-digital converter (ADC) driver block 142, pixel support circuitry block 144, and timing-and-control and data processing block 150.

In various embodiments, pixel array 101 includes a plurality of CMOS imaging sensors arranged in a series of rows and columns. Embodiments are not limited to a particular number of CMOS imaging sensors, or to a particular number of row or columns of such sensors. In various embodiments, pixel array 101 may include more than a million CMOS imaging sensors.

In various embodiments, pixel readout block 110 includes at least one column amplifier and associated circuitry to read out electrical signals provided by the CMOS imaging sensors included in pixel array 101. In various embodiments, pixel readout block 110 includes a column amplifier and associated circuitry for each column in pixel array 101.

In various embodiments, bias current and reference voltage generation block 140, in conjunction with column readout, gain and ADC driver block 142 may provide specific voltages for operation of the pixel array 101. ADC block 120 may provide a conversion from analog signals to digital the signals provided by the pixel readout block 110. The analog-to-digital (A/D) conversion itself is carried out by ADC block 120, which may include an array of A/D converters of any type, such as successive approximation A/D converters. The control of pixel array 101 is effected by a timing and control data processing block 150 and the pixel support circuitry block 144. Pixel support circuitry may include row drivers used to drive the pixels in the pixel array row by row.

In various embodiments, system 100 includes a display 112. Display 112 is not limited to any particular type of display. In various embodiments, display 112 may comprise a plasma display or a light emitting diode (LED) display. In various embodiments, display 112 may comprise a touch screen or other type of device that allows a user to input data to system 100. In various embodiments, display 112 may be coupled to at least one circuit on substrate 108 thorough interconnect 130. In various embodiments, display 112 may be coupled to processor 116 though interconnect 130.

In some embodiments, system 100 includes a keypad 114. Keypad 114 is not limited to any particular type of keypad. In various embodiments, keypad 114 includes a keypad having backlighting to illuminate any text, characters, or symbols included on one or more keys included in keypad 114. In various embodiments, keypad 114 may be coupled to at least one circuit on substrate 108 thorough interconnect 132. In various embodiments, keypad 114 may be coupled to processor 116 though interconnect 132.

In various embodiments, system 100 includes an I/O connection 118 coupled to processor 116 through interconnect 136. I/O connection 118 and interconnect 136 are not limited to any particular type of devices, and may be any type of devices used to connect processor 116 to an external device (not shown) through I/O connection 118 and interconnect 136. In some embodiments, I/O connection 118 comprises a wireless connection to communicatively couple system 100 to one or more external devices (not shown), or a network, such as the Internet. In various embodiments, I/O connection 118 is coupled to an antenna 119 to receive signals at system 100, to transmit signals from system 100, or to both receive at and to transmit signals from system 100, perhaps using a transceiver.

In operation, system 100 may receive light or other electromagnetic radiation as an image or series of images through lens 154. Lens 154 provides the incident images to pixel array 101, which in turn provides electronic signals representing the images recorded by pixel array 101. The pixels within pixel array 101 may be individually read, and the resulting signals can be processed by imaging sensor 103 to produce at least one electrical representation of the incident image. Control and processing of the electrical representation of the recorded image or images may be controlled by the electronic circuitry included in imaging sensor 103. In various embodiments, control and processing of the image or images may be influenced by control signals provided by processor 116. In various embodiments, the image or images provide by imaging sensor 103 may be stored in memory 117.

In various embodiments, at least one image provided by imaging sensor 103 may be displayed on display 112. In various embodiments, at least one image provided by imaging sensor 103 may be transmitted though I/O connection 118 to another device (not shown). Transmitting images provided by imaging sensor 103 may include emailing them to another device. In various embodiments, the images provided by imaging sensor 103 may have additional information added to the image, such as text information or other images or symbols or graphics superimposed on the at least one image provided by the imaging sensor 103. In various embodiments, text information added to the image provided by imaging sensor 103 is entered by a user through keypad 114, or through display 112. In various embodiments, text information added to the image provided by imaging sensor 103 is received through I/O connection 118, such as the text being received as an email.

Figure 2:
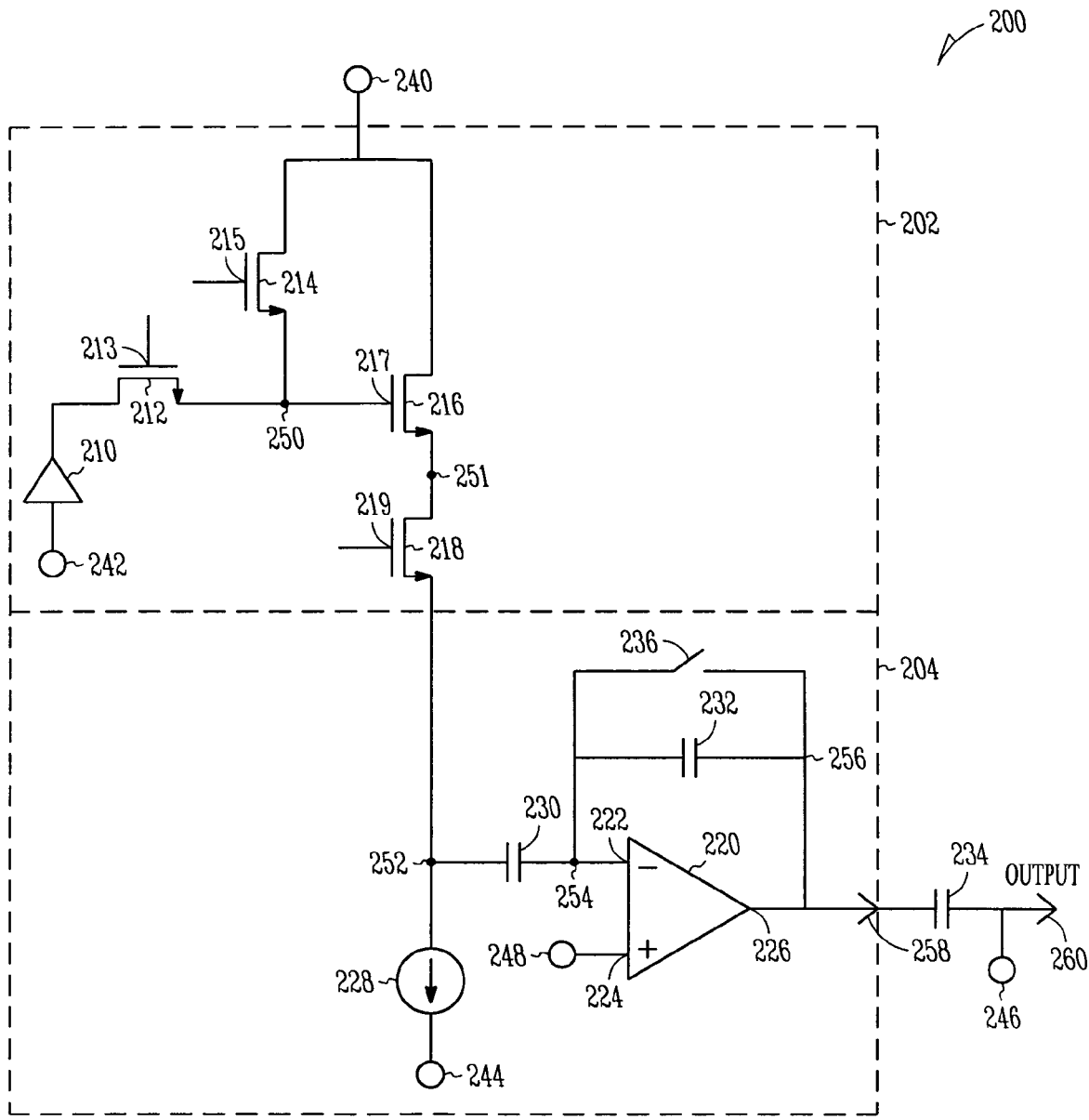
FIG. 2 is a simplified schematic diagram of a readout circuit according to various embodiments of the invention.

FIG. 2 is a simplified schematic diagram of a readout circuit according to various embodiments of the invention. Schematic diagram 200 illustrates a simplified circuit including a portion of a pixel array 202 and a portion of readout circuitry 204. Pixel array 202 includes one or more photodiodes 210 and transistors 212, 214, 216, and 218. In various embodiments, photodiode 210 comprises a CMOS device, such as a CMOS photodiode. However, many embodiments are not limited to using photodiodes. Any device capable of providing an electrical signal in response to incident electromagnetic radiation may be used. For example, a photoresistive device may be used in place of photodiode 210.

Pixel array 202 may include any number of pixels. In various embodiments, pixel array 202 may be similar to or identical to the pixel array 101 shown in FIG. 1. In various embodiments, photodiode 210 includes a cathode coupled to a voltage potential at node 242, and an anode coupled to a source/drain of transistor 212. Transistor 212 includes another source/drain coupled to node 250, and a gate coupled to a select signal input 213. Transistor 214 includes a source/drain coupled to a voltage potential at node 240, another source/drain coupled to node 250, and a gate coupled to reset signal input 215. Transistor 216 includes a source/drain coupled to a voltage potential at node 240, another source/drain coupled to node 251, and a gate coupled to node 250. Transistor 218 includes a source/drain coupled to node 251, another source/drain coupled to node 252 in readout circuitry 204, and a gate coupled to a row select signal input 219.

Transistors 212, 214, 216, and 218 may comprise any type of transistors, such as metal-oxide semiconductor (MOS) type transistors, including CMOS transistors. Transistors 212, 214, 216, and 218 as shown in FIG. 2 are p-type devices. However, it should be understood that n-type devices may be used in place of one or more of transistors 212, 214, 216, and 218 while maintaining the functionality of pixel array 202 as described herein.

Readout circuitry 204 includes current source 228, capacitor 230, capacitor 232, switch 236, and amplifier 220. Amplifier 220 is not limited to any particular type of amplifier. Current source 228 may include an input side coupled to node 252, and an output side coupled to a voltage potential at node 244. In various embodiments, amplifier 220 includes an input 222 coupled to a gate of at least one transistor within amplifier 220 having a first channel ratio, and an input 224 coupled to a gate of at least one transistor within amplifier 220 having a channel ratio different from the first channel ratio, as further described with respect to FIGS. 3-7. In various embodiments, input 222 is an inverting input to amplifier 220. In various embodiments, input 224 is a non-inverting input to amplifier 220. Amplifier 220 may include an output 226. In various embodiments, amplifier 220 may comprise an operational amplifier, such as a CMOS operational amplifier.

In various embodiments, input 222 is coupled to a node 254, and input 224 is coupled to a voltage potential at node 248. In various embodiments, a first side of capacitor 230 may be coupled to node 252, and a second side of capacitor 230 may be coupled to node 254. In various embodiments, a first side of capacitor 232 may be coupled to node 254, and a second side of capacitor 230 may be coupled to node 256. In various embodiments, a first side of switch 236 may be coupled to node 254, and a second side of switch 236 may be coupled to node 256. Various embodiments, include a control circuit coupled to the switch and operable to open and close the switch, wherein closing the switch provides a reset of a value stored in the sample and hold capacitor, and opening the switch provides an amplified sample of an output from one of the plurality of pixels to the sample and hold capacitor. In various embodiments, the control circuitry may be control circuit timing and control and data processing block 150 as shown in FIG. 1.

In various embodiments, output 226 may be coupled to node 256 and coupled to output 258. Output 258 may be coupled to a first side of sample and hold capacitor 234. A second side of sample and hold capacitor 234 may be coupled to a voltage potential at node 246. In various embodiments, the second side of capacitor 234 may be coupled to output 260.

Voltage potentials at nodes 240, 242, 244, 246, and 248 are not limited to any particular voltage potentials. In various embodiments, the voltage potential at node 240 is a positive voltage potential relative to the voltage potentials at nodes 242, 244, and 246. In various embodiments, the voltage potentials at nodes 242, 244, and 246 may be grounded. In various embodiments, the voltage potential at node 248 may be a reference voltage potential. In various embodiments, the voltage potential at node 248 is a positive voltage potential having a value above ground and less than the voltage potential at node 240.

In operation, a voltage potential is provided by photodiode 210 representative of one or more parameters included in the electromagnetic radiation incident at photodiode 210. The one or more parameters may include, but are not limited to, the intensity of the incident radiation, and the one or more particular wavelengths present in the incident radiation. For example, photodiode 210 may provide one or more voltage levels indicating the colors represented by the various wavelengths of the electromagnetic radiation incident at photodiode 210. In various embodiments, the photodiode 210 converts the parameters of the incident electromagnetic radiation to an electronic signal, perhaps as a voltage or current representing one or more parameters of the incident electromagnetic radiation.

By applying a combination of signals to the inputs 213, 217, and 219 of transistors 212, 216, and 218 respectively, the voltage present at the cathode of photodiode 210 may be coupled to node 252 of readout circuitry 204. Node 252 is coupled to input 222 of amplifier 220 through capacitor 230. Assuming switch 236 is open, the voltage from photodiode 210 is applied through capacitor 230 to input 222. Based on the voltage difference between the voltage coupled from photodiode 210 to input 222 of amplifier 220 and the voltage provided at input 224 of amplifier 220, amplifier 220 may provide an output current which in turn may be used to charge sample and hold capacitor 234 to a value representing the voltage provided by photodiode 210. Once sample and hold capacitor 234 has been charged to the representative value, photodiode 210 may be electrically uncoupled from amplifier 220. The representative value may be retained in sample and hold capacitor 234, which then may be provided to output 260 and to one or more other circuits (not shown in FIG. 2) for further processing.

This additional circuitry may comprise any of the circuitry associated with the pixel array 101 as shown in FIG. 1. Various embodiments include a control circuit coupled to at least some of the column lines included in of each of the plurality of columns of pixels, the control circuit operable to control the coupling of each of the pixels to one of a first column amplifier inputs.

Returning to FIG. 2, after the sample and hold capacitor 234 is charged, photodiode 210 may be reset by applying signals to inputs 213 and 215 of transistors 212 and 214, respectively, to couple photodiode 210 to the voltage potential at node 240, while applying signals to inputs 217 and 219 of transistors 216 and 218 to electrically uncouple photodiode 210 from readout circuitry 204. In various embodiments, after a value stored on sample and hold capacitor 234 no longer needs to be retained, sample and hold capacitor 234 may be reset by closing switch 236 and allowing sample and hold capacitor 234 to be discharged through switch 236 and current source 228 to the voltage potential at node 244. Following discharge, sample and hold capacitor 234 is ready to accept another charge value representative of the value of another electrical signal provided by a photodiode in the pixel array 202.

In various embodiments, amplifier 220 may be successively coupled to a number of photodiodes (including photodiode 210) in the same column of pixel array 202. In various embodiments, an entire row of photodiodes included in pixel array 202 may be read at about the same time, wherein each photodiode in the row being read is coupled to a separate column amplifier, such as amplifier 220, such that values for the entire row of photodiodes can be stored in separate sample and hold capacitors (including sample and hold capacitor 234).

Figure 3:
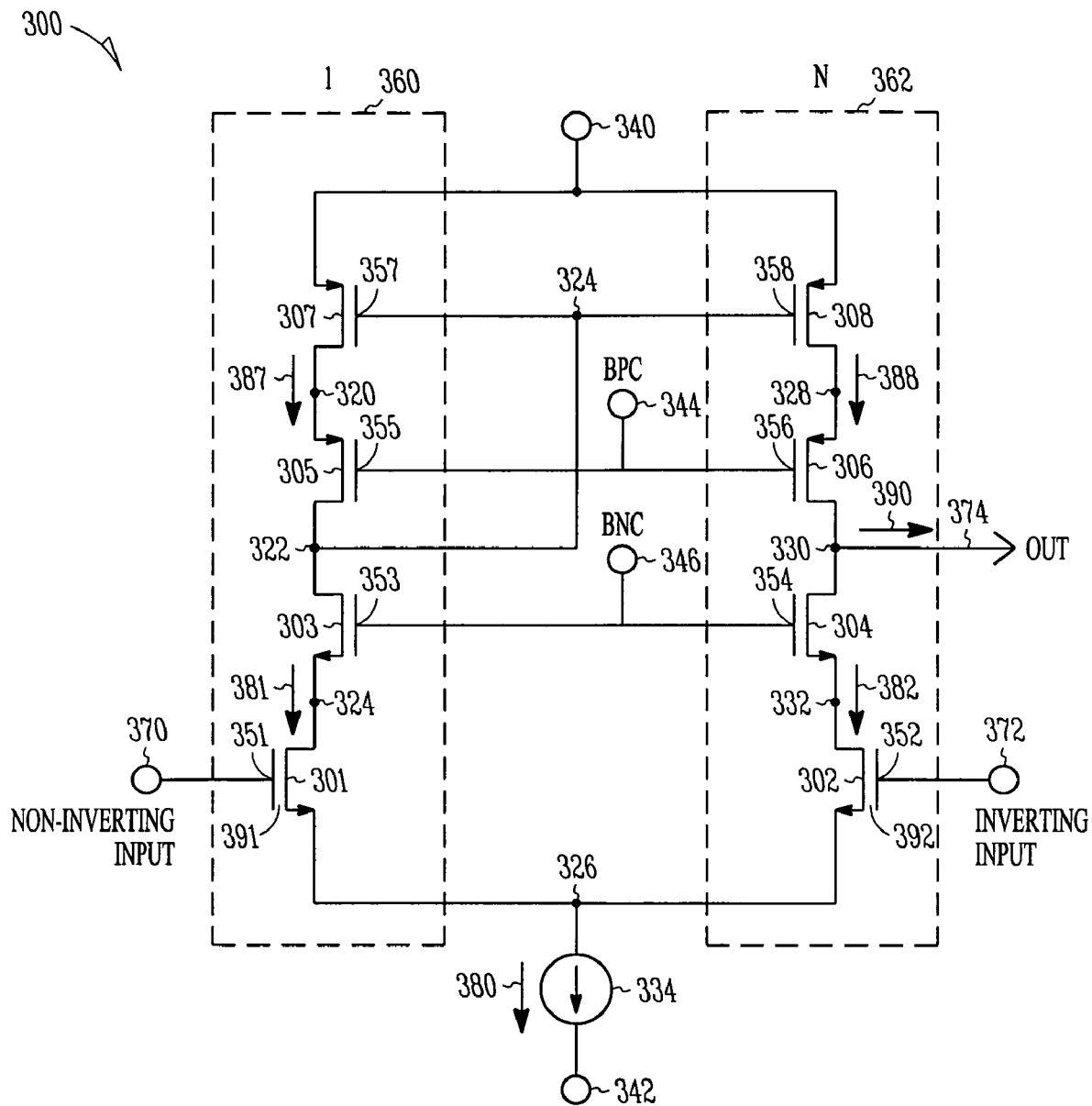
FIG. 3 is a simplified schematic diagram of an amplifier according to various embodiments of the invention.

FIG. 3 is a simplified schematic diagram of an amplifier according to various embodiments of the invention. Amplifier 300 is shown in a simplified form, so as not to obscure the operations and elements described herein, and may not include all of the devices and connections present in a commercial version of the operational amplifier 300. Thus, amplifier 300 may include one or more additional components that are not shown here, as would be understood by those of ordinary skill in the art.

In various embodiments, amplifier 300 includes a non-inverting input 370, an inverting input 372, and an output 374. In various embodiments, amplifier 300 may be similar to or identical to amplifier 220 shown in FIG. 2.

Returning to FIG. 3, amplifier 300 may include a first plurality of series-connected transistors 360 and a second plurality of series-connected transistors 362. In various embodiments, the first plurality of series-connected transistors 360 includes the same number of transistors as the second plurality of series-connected transistors 362, although embodiments of the invention are not so limited.

In various embodiments, the first plurality of series-connected transistors 360 includes transistors 301, 303, 305, and 307. Transistor 307 may include a source/drain coupled to a voltage potential at node 340, another source/drain coupled to node 320, and a gate 357 coupled to node 324. Node 324 may be coupled to node 322. Transistor 305 may include a source/drain coupled to node 320, another source/drain coupled to node 322, and a gate 355 coupled to node 344. Transistor 303 may include a source/drain coupled to node 322, another source/drain coupled to node 324, and a gate 353 coupled to node 346. Transistor 301 may include a source/drain coupled to node 324, another source/drain coupled to node 326, and a gate 351 coupled to input 370.

In various embodiments, transistor 301 has a channel ratio 391. Channel ratio refers herein to a ratio of a channel width and a channel length for a particular transistor, that is, channel ration is W/L, wherein W is the channel width, and L is the channel length. Channel width and channel length refer to the physical dimensions of the channel region of a particular transistor, as would be understood by those of ordinary skill in the art. In various embodiments, transistors 303, 305, and 307 each have a channel ratio that is about the same value as the channel ratio 391 of transistor 301, although embodiments are not limited to having each one, or to having any of the channel ratios of transistors 303, 305, and 307 being substantially the same as the channel ratio of transistor 301. In various embodiments, the channel ratio of transistor 301 is determined to have a representative value of "1" as is indicated by the number "1" shown above the first plurality of series-connected transistors 360 in FIG. 3.

The second plurality of series-connected transistors 362 includes transistors 302, 304, 306, and 308. Transistor 308 may include a source/drain coupled to a voltage potential at node 340, another source/drain coupled to node 328, and a gate 358 coupled to node 324. Transistor 306 may include a source/drain coupled to node 328, another source/drain coupled to node 330, and a gate 356 coupled to node 344. Transistor 304 may include a source/drain coupled to node 330, another source/drain coupled to node 332, and a gate 354 coupled to node 346. Transistor 302 may include a source/drain coupled to node 332, another source/drain coupled to node 326, and a gate 352 coupled to input 372. In various embodiments, output 374 may be coupled to node 330.

In various embodiments, transistor 302 has a channel ratio 392. In various embodiments, transistors 303, 305, and 307 each have a channel ratio that has the same value as the channel ratio 392 of transistor 302, although embodiments are not limited to having each one, or to having any of the channel ratios of transistors 303, 305, and 307 being substantially the same as the channel ratio of transistor 302. In various embodiments, the channel ratio of transistor 302 is determined to have a representative value of "N" as is indicated by the letter "N" shown above the first plurality of series-connected transistors 362 in FIG. 3.

In various embodiments, channel ratio 392 has a different value from the value of channel ratio 391. A ratio of channel ratios 392 and 391 may be determined by dividing the value for the channel ratio 392 by the value of channel ratio 391. In various embodiments, where "1" is used to represent the value of channel ratio 391, a ratio of the channel ratios between the first plurality of series-connected transistors 360 and the second plurality of series-connected transistors 362 may be determined by dividing a value for "N" by 1. In various embodiments, "N" is an integer having a value greater than 1 and less than or equal to 11 (e.g., the channel ratio 392 is an integer multiple of about 2 to about 11 times the channel ratio 391). In various embodiments, "N" is any number between 2 and 11 and including 2 and 11.

In various embodiments, node 344 may comprise a bias positive channel MOS (PMOS) cascade (BPC) input. The node 344 may provide a bias input for transistors 305 and 306. The node 346 may comprise a Bias negative channel MOS (NMOS) cascade (BNC) input. The node 346 may provide a bias input for transistors 303 and 304. In various embodiments, node 340 may be coupled to a voltage potential. The voltage potential coupled to node 340 is not limited to any particular voltage potential. In various embodiments, the voltage potential coupled to node 340 is a positive voltage potential having a value higher than any voltages applied to node 342. In some embodiments, node 342 is coupled to ground. Similarly, the voltage potential coupled to node 342 is not limited to any particular voltage potential. Any combination of voltage potentials may be applied to node 340 and node 342 that allows amplifier 300 to receive input signals at inputs 370 and 372 and to provide output signals at output 374.

In some embodiments, amplifier 300 includes a bias current 380 flowing between node 326 and node 342. The bias current 380 may be provided by bias current source 334, which is not limited to any particular type of current source. In various embodiments, a current value for bias current 380 represents the total current value for drain current 381 and for drain current 382. In various embodiments, bias current source 334 may be a bias current source coupled to the first transistor and to the second transistor and operable to provide a total biasing current split between the first transistor and the second transistor approximately in proportion to the first channel ratio and the second channel ratio, respectively.

In general, the smaller the value for bias current 380, the smaller the overall amount of current consumed by amplifier 300. In general, a small bias current 380 is desirable, as it may lead to reduced overall current consumption.

In operation, signals, including voltage, may be provided at the inputs 370, 372 of amplifier 300. In various embodiments, the signal at input 372 may be provided by a photodiode in a pixel array, and the signal provided at input 370 may comprise a reference voltage.

Based on the difference in the voltages provided at inputs 370 and 372, amplifier 300 should operate to provide an output signal at output 374. Based on the difference in the voltages provided at inputs 370 and 372, a drain current 381 will flow through transistor 301, a drain current 387 will flow through transistor 307, a drain current 382 will flow through transistor 302, and a drain current 388 will flow through transistor 308. Because transistors 301 and 307 are series-connected as part of the first plurality of series-connected transistors 360, drain current 387 will be approximately equal to drain current 381. Because transistor 307 and transistor 308 are coupled as a current mirror, drain current 388 will be approximately equal to drain current 387.

Drain current 388 may be divided between an output current 390 provided to output 374 through node 330, and drain current 382 provided to transistor 302 through node 330. For small differences between voltages at the inputs 370 and 371, the output current 390 provided at output 374 may be determined by the following equations:

$$I_{out} \approx I_{308} - I_{302} \approx V_d * (2 * I_{302}/V_{dsat302}) \approx V_d * (2*N)/(N+1) * (I_b/V_{dsat302})$$

where:
Iout represents the output current 390 provided at output 374.

$I_{308}$ represents drain current 388 through transistor 308.

$I_{302}$ represents drain current 382 through transistor 302.

Vd represents the difference in the voltage value present between inputs 370 and 371.

Ib represents the bias current 380.

$Vd_{sat302}$ represents the saturation voltage of transistor 302, which is a function of the biasing current Ib, the transistor size of transistor 302, and the process transconductance parameters. $Vd_{sat302}$ is typically set to somewhere between 0.1 and 0.3 volts.

N represents the channel ratio for the second plurality of series-connected transistors 362 relative to the channel ratio for the first plurality of series-connected transistors 360 assuming the channel ratio for the first plurality of series-connected transistors 360 has a representative value of 1.

The saturation voltage of transistor 302 and 301 is a function of biasing current Ib. In embodiments where the first channel ratio and the second channel ratio of the series-connected transistors 360 and 362 are the same—that is 1:1, the bias current Ib is evenly divided between the transistors 301 and 302. In embodiments where the first channel ratio is 1, and the second channel ratio is N (and N is larger than 1), the bias current Ib may be split between transistor 301 and transistor 302 by a ratio of 1:N.

By way of example, a first amplifier and a second amplifier having the same biasing current Ib and each having Vdsat for transistor 301 equal to Vdsat for transistor 302, wherein the first amplifier has a ratio channel ratios of 1:1 and the second amplifier has a ratio of channel ratios of 1:N wherein N has a value between 2 and 10 (including 2 and 10), the second amplifier may be shown to have a gain bandwidth of:

(2*N)/(N+1) times the gain bandwidth for the first amplifier.

Thus for a second amplifier having a value of 5 for N, the gain bandwidth of (2*5)/(5+1) for the second amplifier is 1.6 times the gain bandwidth of the fist amplifier.

A slew rate for the first amplifier having a ratio of channel ratios of 1:1 may be determined as:

Slew rate≈Ib/$C_{out}$ where:

Ib represents the total bias current.

$C_{out}$ represents the capacitive load at the output node of the amplifier.

In comparison, a slew rate the second amplifier having a ratio of channel ratios of 1:N wherein N has a value between 2 and 10 and including 2 and 10 may be determined as:

Slew rate≈N*Ib/Cout where:

Ib represents the total bias current.

$C_{out}$ represents the capacitive load at the output node of the amplifier.

N represents the channel ratio for the second plurality of series-connected transistors 362 relative to the channel ratio for the first plurality of series-connected transistors 360, assuming the channel ratio for the first plurality of series-connected transistors 360 has a representative value of 1.

In comparing the slew rates for the first amplifier and the second amplifier, a theoretical improvement of 5 times may be expected for the second amplifier as compared to the slew rate for the first amplifier.

By providing an amplifier having a ratio of channel ratios of 1:N between a first plurality of series-connected transistors and a second plurality of series-connected transistors, wherein N is a value between about 2 and about 10 (including 2 and 10), or between about 5 and about 10, a column amplifier may be designed so that for a given value of bias current, an improved gain bandwidth and an improved slew rate may result. These improvements in gain bandwidth and slew rate can provide better performance of the column amplifier at faster clock speeds when used for processing the signals provided by an imaging sensor.

Figure 4:
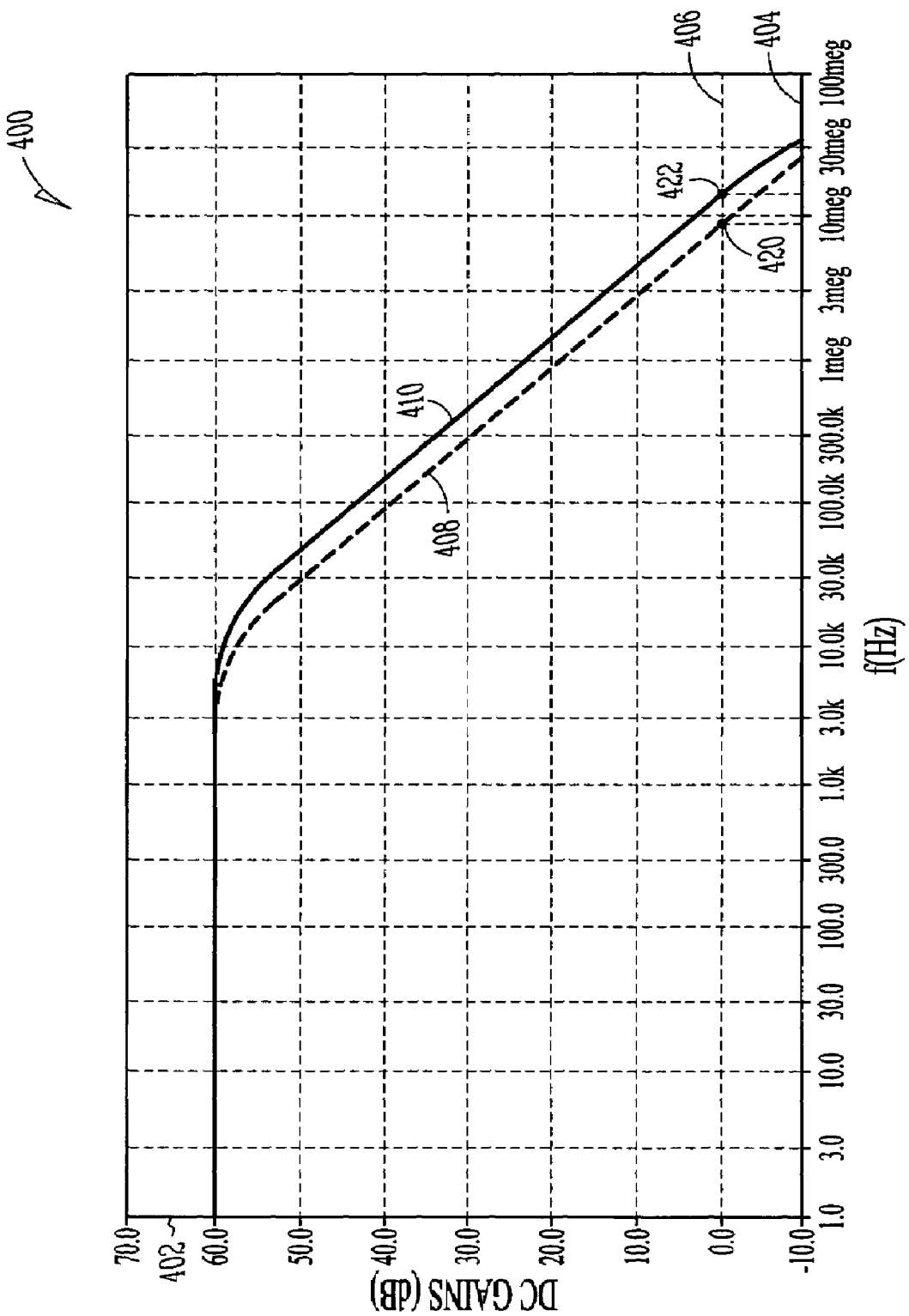
FIG. 4 is a graph illustrating amplifier gain bandwidth products according to various embodiments of the invention.

FIG. 4 is a graph illustrating amplifier gain bandwidth products according to various embodiments of the invention. FIG. 4 includes a chart 400 showing gain bandwidth products for various amplifiers. The gain bandwidth product is the open-loop voltage amplification measured at a selected frequency. Chart 400 includes vertical axis 402 and horizontal axis 404. Vertical axis 402 indicates various DC gains in decibels ranging from −10.0 db to 70 db. Horizontal axis 404 indicates a range of frequencies in hertz for output signals provided by an amplifier. Horizontal axis 404 in chart 400 represents a non-linear scale of frequencies ranging from 1.0 hertz to 100 megahertz. Line 406 represents a level at any frequency having unity gain bandwidth.

Chart 400 includes a gain bandwidth curve 408 and a gain bandwidth curve 410 resulting from simulating the operation of amplifiers designed according to various embodiments described herein, based on CMOS technology with typical NMOS and typical PMOS process corners at a temperature of 20 degrees C. In simulating the operation of an amplifier such as amplifier 300 as shown in FIG. 3, the following parameters are referred to as the "first parameter set":

transistor 301: W=1.4 µm, L=0.7 µm, m=3
transistor 302: W=1.4 µm, L=0.7 µm, m=3
transistor 303: W=1.4 µm, L=0.7 µm, m=3
transistor 304: W=1.4 µm, L=0.7 µm, m=3
transistor 305: W=1.4 µm, L=0.7 µm, m=3
transistor 306: W=1.4 µm, L=0.7 µm, m=3
transistor 307: W=1.4 µm, L=0.7 µm, m=3
transistor 308: W=1.4 µm, L=0.7 µm, m=3
Biasing Current: Ib=12 µA
Capacitive Loading: Cout=1.5 pF
Power Supply: 2.8 volts at node 340, ground at node 342
Channel ratio of first plurality of series-connected transistors 360: 1
Channel ratio of second plurality of series-connected transistors 362: 1 where:

W represents a channel width for the transistor,
L represents a channel length for the transistor, and
m represents the multiplier as would be understood by those in the art of IC transistor design.

In simulating the operation of an amplifier such as amplifier 300 as shown in FIG. 3, the following parameters are referred to as the "second parameter set":

transistor 301: W=1.4 µm, L=0.7 µm, m=1
transistor 302: W=1.4 µm, L=0.7 µm, m=5
transistor 303: W=1.4 µm, L=0.7 µm, m=1
transistor 304: W=1.4 µm, L=0.7 µm, m=5
transistor 305: W=1.4 µm, L=0.7 µm, m=1
transistor 306: W=1.4 µm, L=0.7 µm, m=5
transistor 307: W=1.4 µm, L=0.7 µm, m=1
transistor 308: W=1.4 µm, L=0.7 µm, m=5
Biasing Current: Ib=12 µA
Capacitive Loading: Cout=1.5 pF
Power Supply: 2.8 volts at node 340, ground at node 342
Channel ratio of first plurality of series-connected transistors 360: 1
Channel ratio of second plurality of series-connected transistors 362: 5 where:
- W represents a channel width for the transistor,
- L represents a channel length for the transistor, and
- m represents the multiplier as would be understood by those in the art of IC transistor design As a result of simulating the operation of an amplifier, such as amplifier 300 of FIG. 3, a gain bandwidth curve 408 and a gain bandwidth curve 410 were produced. Gain bandwidth curve 408 represents the gain bandwidth of an amplifier using the first parameter set as described above, including a ratio of channel ratios having a value of 1, with the first channel ratio being "1" and the second channel ratio "N" being 1, that is, a 1:N ratio having a value of 1. Gain bandwidth curve 410 represents the gain bandwidth of an amplifier using the second parameter set described above, including a ratio of channel ratios having a value of 5, with the first channel ratio being "1" and the second channel ratio "N" being 5, that is, a 1:N ratio having a value of 5. That is, the amplifier using the second parameter set has been designed according to the various embodiments of the invention described herein As illustrated in FIG. 4, both gain bandwidth curves 408 and 410 have a DC gain of about 60 dB up to a frequency of about 1.0 kilohertz. As the frequency increases above 10.0 khertz, the bandwidth curve 408 has a smaller DC gain value at any given frequency as compared to the gain bandwidth of curve 410 for the same frequency.

Another way of measuring the difference between gain bandwidth curves 408 and 410 is to compare the frequency at which each gain bandwidth curve crosses the unity gain bandwidth line 406. The unity gain bandwidth line 406 represents an output level wherein in the DC gain of the amplifier is 1. As shown in FIG. 4, gain bandwidth curve 408 crosses the unity gain bandwidth line 406 at point 420, representing a frequency of about 8.4 MHertz. The gain bandwidth curve 410 crosses the unity gain bandwidth line 406 at point 422, representing a frequency of about 13.2 MHertz. Thus, the gain bandwidth curve 410 representative of an amplifier having a 1:N ratio of 5 provides about a 1.6 times improvement in unity gain bandwidth over an amplifier having a 1:N ratio of 1 under the same operating conditions.

Figure 5:
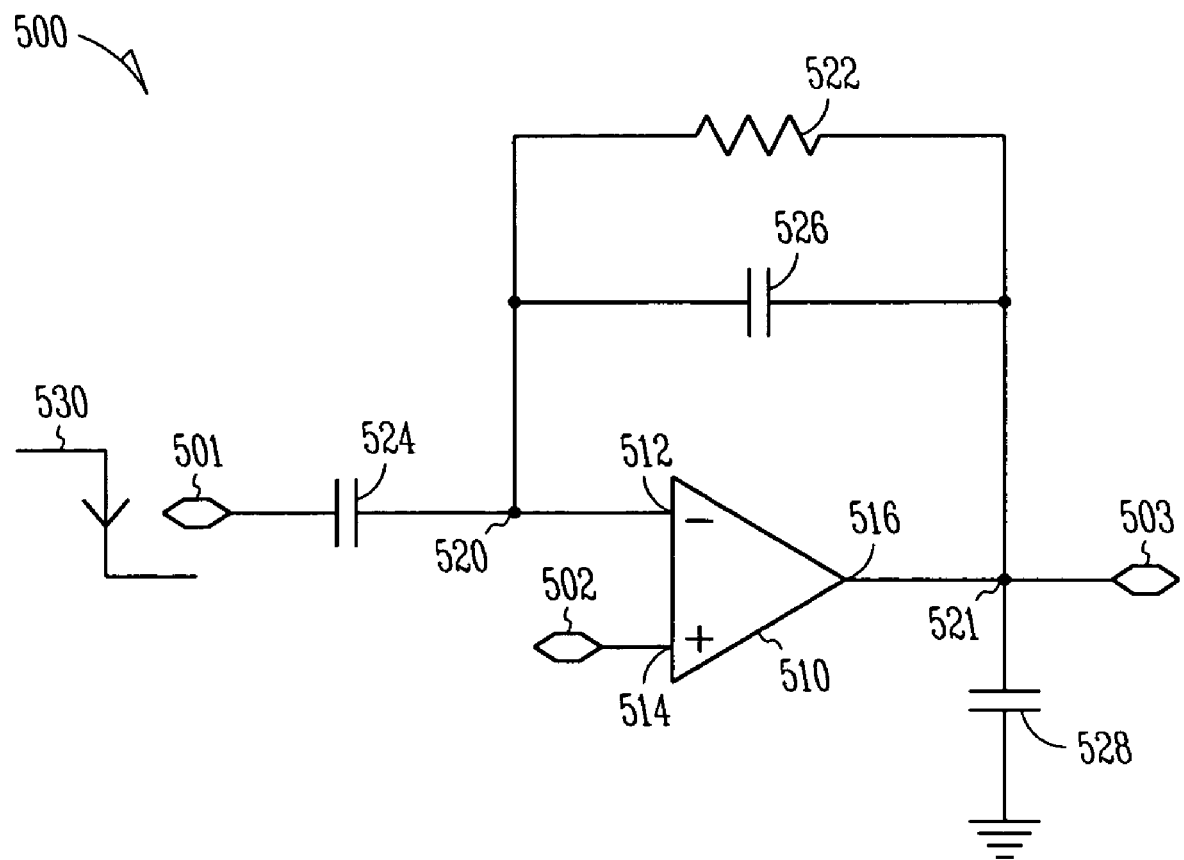
FIG. 5. is a schematic diagram of a simulation circuit according to various embodiments of the invention.
Figure 6:
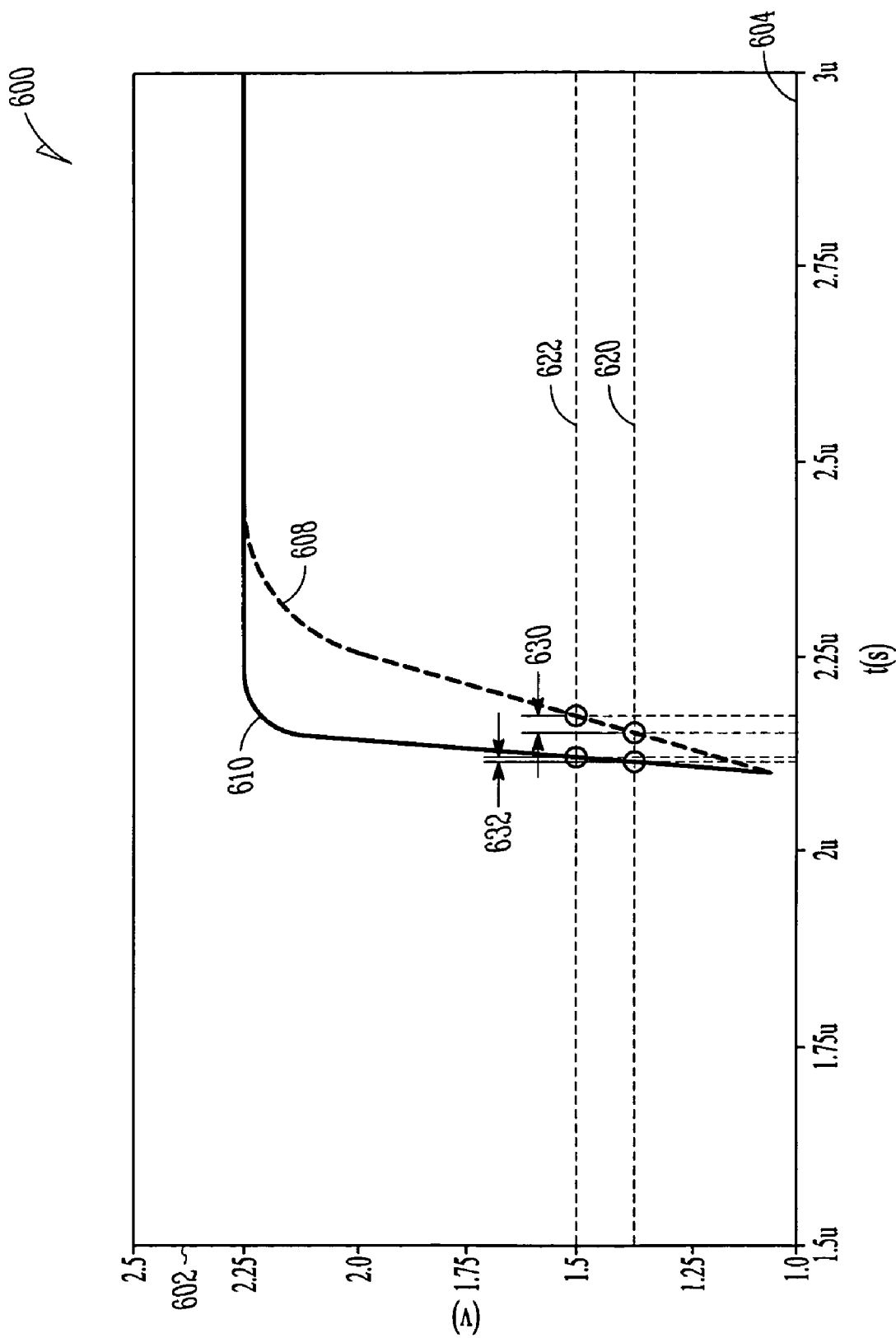
FIG. 6 is a graph illustrating amplifier slew rates according to various embodiments of the invention.

FIG. 5. is a schematic diagram of a simulation circuit according to various embodiments of the invention. FIG. 5 includes a configuration for a circuit 500 used in the simulation performed on amplifiers to compare slew rates. The results of the simulation are shown in FIG. 6. In FIG. 5, it can be seen that the simulation was performed on an amplifier 510 coupled to capacitors 524, 526, and 528, resistor 522. The amplifier 510, which may be designed according to the embodiments described herein, has a circuit inputs 501 and 502, and circuit output 503. Capacitor 524 includes a first side coupled to circuit input 501, and a second side coupled to node 520. Capacitor 526 includes a first side coupled to node 520, and a second side coupled to node 521. Resistor 522 includes a first side coupled to node 520, and a second side coupled to node 521. Capacitor 528 includes a first side coupled to node 521, and a second side coupled to the voltage potential representative of ground.

Amplifier 510 includes a first amplifier input 512, a second amplifier input 514, and an amplifier output 516. As shown in FIG. 5, input 512 is an inverting input of amplifier 510, and input 514 in a non-inverting input of amplifier 510. Amplifier input 512 is coupled to node 520, and amplifier input 514 is coupled to input 502. Amplifier output 516 is coupled to node 521. Node 521 is coupled to circuit output 503.

In operation, a reference voltage of 1.25 volts was applied at circuit input 502, and a 1 volt step function 530 was applied to circuit input 501. The rate of change of the output voltage (slew rate) is measured by determining the voltages over time at circuit output 503.

FIG. 6 is a graph illustrating amplifier slew rates according to various embodiments of the invention. FIG. 6 illustrates a graph 600 of the result of operating the circuit 500 in FIG. 5 with respect to two different amplifiers 510, one of which was designed according to various embodiments of the invention. This graph shows in pictorial form that in addition to the improved gain bandwidth, embodiments described herein provide improved slew rates for amplifiers as compared to amplifiers having a 1:N ratio of 1 under the same operation conditions. Graph 600 includes a vertical axis 602 indicating voltages, and a horizontal axis 604 indicating time in microseconds. Graph 600 includes voltage level line 620 representing about 1.4 volts, and voltage level line 622 representing about 1.5 volts. A measurement of slew rate over a range of voltages between voltage level line 620 and 622 may be determined by measuring the amount of time required along horizontal axis 604 for the output voltage being measured along a curve in graph 600 to move from voltage level line 620 to voltage level line 622.

In a first instance, amplifier 510 includes an amplifier having the first parameter set described herein, with a ratio of channel ratios having a value of 1, with the first channel ratio being "1" and the second channel ratio "N" being 1, that is, a channel ratio between the first plurality of series-connect transistors and the second plurality of series-connected transistors included in the amplifier 510 of 1:1. The slew rate curve 608 in FIG. 6 represents the results of a simulation performed using the first parameter set for circuit 500 of FIG. 5. Measuring the time 630 along slew rate curve 608 between voltage level lines 620 and 622 results in a slew rate of about 6.4 V/μs.

In a second instance, amplifier 510 includes an amplifier having the second parameter set as described herein, designed according to various embodiments of the invention, including a ratio of channel ratios having a value of 5, with the first channel ratio being "1" and the second channel ratio "N" being 5, that is, a channel ratio between the first plurality of series-connect transistors and the second plurality of series-connected transistors included in the amplifier 510 of 1:5. A slew rate curve 610 in FIG. 6 represents the results of a simulation performed using the second parameter set for circuit 500 of FIG. 5. Measuring the time 632 along slew rate curve 608 between voltage level lines 620 and 622 results in a slew rate of about 26.7 V/μs.

Comparing the slew rates for the first instance with the slew rate in the second instance, the results demonstrate an approximate improvement of four times using an amplifier having the ratio of channel ratios of 1:5 as compared to the amplifier having the ratio of channel ratios of 1:1.

In addition, the simulated settling time to 10-bit accuracy was about 0.16 μs for the amplifier in the second instance (having the ratio of channel ratios of 1:5), as compared to a settling time of about 0.42 μs for the amplifier in the first instance (having the ratio of channel ratios of 1:1). That is, the amplifier in the second instance demonstrated improvement of about 2.6 times with respect to settling time as compared to the amplifier in the first instance.

Figure 7:
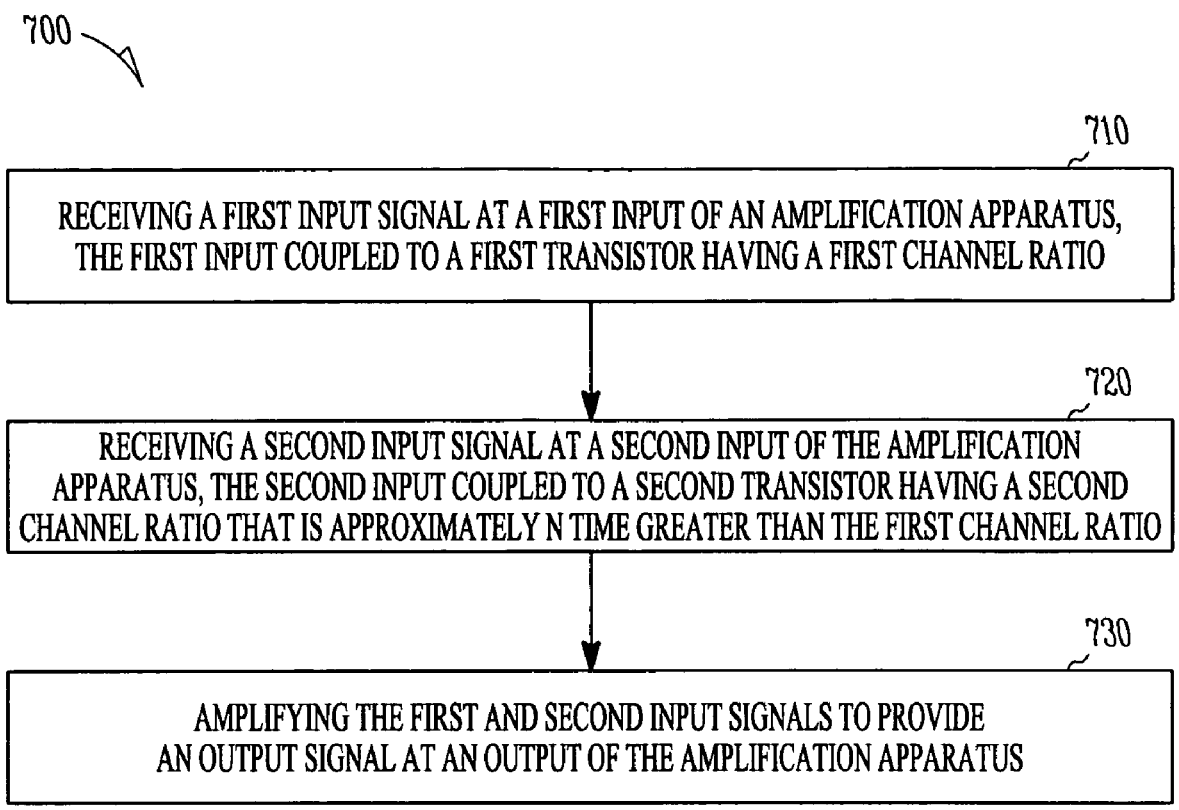
FIG. 7 is a flow diagram illustrating several methods according to various embodiments of the invention.

FIG. 7 is a flow diagram illustrating several methods according to various embodiments of the invention. FIG. 7 illustrates a flow diagram illustrating several methods 700 according to various embodiments of the invention. Method 700 at block 710 may begin by receiving a first input signal at a first input of an amplification apparatus, the first input coupled to a first transistor having a first channel ratio.

Method 700 at block 720 may include receiving a second input signal at a second input of the amplification apparatus, the second input coupled to a second transistor having a second channel ratio that is approximately N times greater than the first channel ratio, wherein N is greater than or equal to two and less than or equal to 10. N may comprise an integer, or not. Receiving the first input signal may include receiving the first input signal from a column line coupled to an array of imaging sensors. Receiving a second signal may include selecting a pixel from a plurality of pixels, each of the plurality of pixels having a pixel output, and receiving the pixel output of the selected pixel as the second signal.

Method 700 at block 730 may include amplifying the first and second input signals to provide an output signal at an output of the amplification apparatus.

Providing the output signal at the output coupled to the second transistor may include providing an output current $I_{out}$ at the output determined by the formula:

$$I_{out} \approx V_d * (2*N)/(N+1) * (I_b/Vsat_{2nd})$$

wherein $V_d$ is a differential voltage appearing between the first input and the second input, N is a fraction determined by the second channel ratio and the first channel ratio, $I_b$ is a total bias current of the amplifier, and $Vsat_{2nd}$ is a saturation voltage of the second transistor.

Amplifying the first and the second input signal may thus include providing an output signal having a slew rate that is approximately proportional to N and/or a gain bandwidth that is determined by approximately twice the value of N divided by N+1. As noted above, N may be equal to about 2, 5, or 10, greater than or equal to 2 and/or less than or equal to 10. Providing the output signal may include providing a voltage to a sample and hold capacitor representing the difference between the first input signal and a reference voltage provided as the second input signal.

It should be understood that certain types of transistors, such as MOS and CMOS transistors, in addition to having a gate, may not necessarily have a predetermined lead designated as a source and a predetermined lead designated as a drain. The determination as to whether a particular lead of a transistor is a source or a drain may depend on the potentials being applied to the transistor as used in a particular circuit. Thus, the reference to "source/drain" herein is meant to refer to a lead of a transistor where the lead may operate as either a drain or a source depending on the voltages being applied to the transistor under consideration.

It is to be understood that the above description is intended to be illustrative, and not restrictive. For example, the above-described embodiments (and/or aspects thereof) may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

Various embodiments have been described herein for apparatus, methods and systems including an improved amplifier that can be used with imaging sensors. For example, the improved amplifier may be used as a column amplifier to process electrical signals provided by at least one photodiode included in an imaging sensor. In various embodiments, the improved amplifier provides a first input coupled to a first plurality of series-connected transistors, and a second input coupled to a second plurality of series-connected transistors. By providing the second plurality of series-connected transistors having a channel ratio that is different and larger than a channel ratio associated with the first plurality of series-connected transistors, the improved amplifier can provides a higher gain bandwidth, faster slew rates, and improved settling time for a given biasing current as compared to a amplifier having the first and the second plurality of series-connected transistors including the same channel ratio. Because amplifier bias current is limited in some devices due to power constraints of the device, a device using the improved amplifier may also provide improved performance characteristics using less bias current when compared to traditional amplifiers. In addition, because a smaller bias current may result in an overall smaller current requirement for the amplifier, the improved amplifier may provide improved or equal performance characteristics using less bias current as compared to the traditional amplifier.

What is claimed is:

1. A method comprising:
    receiving a first input signal at a first input of an amplification apparatus, the first input coupled to a first transistor having a first channel ratio;
    receiving a second input signal at a second input of the amplification apparatus, the second input coupled to a second transistor having a second channel ratio that is approximately N times greater than the first channel ratio, wherein N is greater than or equal to two; and
    amplifying the first and second input signals to provide an output signal at an output of the amplification apparatus, wherein the output signal has a gain bandwidth that is determined by approximately twice the value of N divided by N+1.

2. The method of claim 1, wherein amplifying the first and the second input signals includes:
    providing the output signal having a slew rate that is approximately proportional to N.

3. The method of claim 1, wherein N has a value of about 5 to about 10.

4. The method of claim 1, wherein receiving the first input signal includes:
    receiving the first input signal from a column line coupled to an array of imaging sensors.

5. The method of claim 1, wherein providing the output signal at the output coupled to the second transistor includes the amplification apparatus providing an output current $I_{out}$ at the output determined by a formula:

$$I_{out} \approx V_d*(2*N)/(N+1)*(I_b/Vsat_{2nd})$$

wherein $V_d$ is a differential voltage appearing between the first input and the second input, N is a fraction determined by the second channel ratio and the first channel ratio, $I_b$ is a total bias current of the amplifier, and $Vsat_{2nd}$ is a saturation voltage of the second transistor.

6. The method of claim 1, wherein providing the output signal includes:
providing a voltage to a sample and hold capacitor representing a difference between the first input signal and a reference voltage provided as the second input signal.

7. The method of claim 1, wherein receiving the second input signal includes:
selecting a pixel from a plurality of pixels, each of the plurality of pixels having an output, and receiving the output of the selected pixel as the second input signal.

8. A system comprising:
a sensor including an array of pixels, the array of pixels including a plurality of columns of pixels, wherein some of the plurality of columns of pixels include a plurality of pixels and a column line coupled to an output of each of the plurality of pixels; and
a plurality of column amplifiers, wherein at least one of the plurality of column amplifiers is coupled to a single one of the column lines at a first column amplifier input and to a voltage reference at a second column amplifier input, wherein the at least one of the plurality of column amplifiers includes a first transistor having a first channel ratio and a first gate coupled to the single one of the column lines, and a second transistor having a second channel ratio that is greater than the first channel ratio, the second transistor including a second gate coupled to the voltage reference, and wherein some of the plurality of column amplifiers provide an output current $I_{out}$ at an output determined by a formula:

$$I_{out} \approx V_d*(2*N)/(N+1)*(I_b/Vsat_{2nd})$$

wherein $V_d$ is a differential voltage appearing between the first column amplifier input and the second column amplifier input, N is a fraction determined by the second channel ratio and the first channel ratio, $I_b$ is a total bias current of the column amplifier, and $Vsat_{2nd}$ is a saturation voltage of the second transistor.

9. The system of claim 8 including:
a control circuit coupled to at least some of the column lines included in each of the plurality of columns of pixels, the control circuit operable to control an electrical coupling of each of the pixels to one of the first column amplifier inputs.

10. The system of claim 8, wherein some of the plurality of column amplifiers include an output coupled to a readout circuit having a sample and hold capacitor.

11. The system of claim 8, wherein some of the plurality of column amplifiers include a switch coupling an output of the column amplifier to the first column amplifier input of the column amplifier.

12. The system of claim 11, including:
a control circuit coupled to the switch and operable to open and close the switch, wherein closing the switch provides a reset of a value stored in a sample and hold capacitor, and opening the switch provides an amplified sample of an output from one of the plurality of pixels to the sample and hold capacitor.

13. The system of claim 8, wherein the second channel ratio is an integer multiple between about 2 and 11 of the first channel ratio.

14. The system of claim 8, wherein some of the plurality of column amplifiers include a first group of transistors in a first plurality of series-connected transistors having a channel ratio about equal to the first channel ratio, and a second group of transistors in a second plurality of series-connected transistors having a channel ratio about equal to the second channel ratio.

15. The system of claim 8, wherein the sensor includes:
a complementary metal oxide sensor.

16. A system comprising:
a cell phone including a camera and a lens to provide images to a sensor including an array of pixels, the array of pixels including a plurality of columns of pixels, wherein some of the plurality of columns of pixels include a plurality of pixels and a column line coupled to an output of each of the plurality of pixels; and
a plurality of column amplifiers, wherein at least one of the plurality of column amplifiers is coupled to a single one of the column lines at a first column amplifier input and to a voltage reference at a second column amplifier input, wherein the at least one of the plurality of column amplifiers includes a first transistor having a first channel ratio and a first gate coupled to the single one of the column lines, and a second transistor having a second channel ratio that is greater than the first channel ratio, the second transistor including a second gate coupled to the voltage reference, and wherein some of the plurality of column amplifiers provide an output current $I_{out}$ at an output determined by the formula:

$$I_{out} \approx V_d*(2*N)/(N+1)*(I_b/Vsat_{2nd})$$

wherein $V_d$ is a differential voltage appearing between the first column amplifier input and the second column amplifier input, N is a fraction determined by the second channel ratio and the first channel ratio, $I_b$ is a total bias current of the column amplifier, and $Vsat_{2nd}$ is a saturation voltage of the second transistor.

17. The system of claim 16, further including:
a memory for storing images received by the camera.

18. The system of claim 16, further including:
an input/output connection coupled to an antenna operable to email images received by the camera.

19. The system of claim 16, further including:
a keypad to user input including text to be superimposed on at least one image received by the camera.

20. The system of claim 16, wherein the sensor includes:
a complementary metal oxide sensor.

21. A system comprising:
a digital camera including a lens to provide images to a sensor including an array of pixels, the array of pixels including a plurality of columns of pixels, wherein some of the plurality of columns of pixels include a plurality of pixels and a column line coupled to an output of each of the plurality of pixels; and
a plurality of column amplifiers, wherein at least one of the plurality of column amplifiers is coupled to a single one of the column lines at a first column amplifier input and to a voltage reference at a second column amplifier input, wherein the at least one of the plurality of column amplifiers includes a first transistor having a first channel ratio and a first gate coupled to the single one of the column lines, and a second transistor having a second channel ratio that is greater than the first channel ratio, the second transistor including a second gate coupled to the voltage reference, and wherein some of the plurality of column amplifiers provide an output current $I_{out}$ at an output determined by the formula:

$$I_{out} \approx V_d*(2*N)/(N+1)*(I_b/Vsat_{2nd})$$

wherein $V_d$ is a differential voltage appearing between the first column amplifier input and the second column amplifier input, N is a fraction determined by the second channel ratio and the first channel ratio, $I_b$ is a total bias current of the column amplifier, and $Vsat_{2nd}$ is a saturation voltage of the second transistor.

22. The system of claim 21, wherein the sensor includes:
a complementary metal oxide sensor.

23. A method comprising:
receiving an image at a lens of a digital camera;
providing the image to a pixel array; and
coupling a signal from the pixel array to at least one amplifier apparatus, wherein coupling the signal to the at least one amplifier includes:
receiving a first input signal at a first input of the amplification apparatus, the first input coupled to a first transistor having a first channel ratio;
receiving a second input signal at a second input of the amplification apparatus, the second input coupled to a second transistor having a second channel ratio that is approximately N times greater than the first channel ratio, wherein N is greater than or equal to two; and
amplifying the first and second input signals to provide an output signal at an output of the amplification apparatus, wherein the output signal has a gain bandwidth that is determined by approximately twice the value of N divided by N+1.

24. The method of claim 23, wherein amplifying the first and the second input signals includes:
providing the output signal having a slew rate that is approximately proportional to N.

25. The method of claim 23, wherein N has a value of about 5 to about 10.

26. The method of claim 23, wherein providing the output signal at the output coupled to the second transistor includes the amplifier providing an output current $I_{out}$ at the output determined by the formula:

$$I_{out} \approx V_d*(2*N)/(N+1)*(I_b/Vsat_{2nd})$$

wherein $V_d$ is a differential voltage appearing between the first input and the second input, N is a fraction determined by the second channel ratio and the first channel ratio, $I_b$ is a total bias current of the amplifier, and $Vsat_{2nd}$ is a saturation voltage of the second transistor.

27. The method of claim 23, wherein providing the output signal includes:
providing a voltage to a sample and hold capacitor representing a difference between the first input signal and a reference voltage provided as the second input signal.

28. The method of claim 23, wherein receiving a second signal includes:
selecting a pixel from a plurality of pixels, each of the plurality of pixels having an output, and receiving the output of the selected pixel as the second signal.

* * * * *